United States Patent [19]
Kushida et al.

[11] Patent Number: 6,120,716
[45] Date of Patent: Sep. 19, 2000

[54] EPOXY RESIN SEALING MATERIAL FOR MOLDING SEMICONDUCTOR CHIP AND METHOD FOR MANUFACTURING THE SAME

[75] Inventors: Takanori Kushida, Yokkaichi; Akio Kobayashi, Suzuka; Yosuke Obata; Hironori Ikeda, both of Yokkaichi; Taro Fukui, Osaka; Masashi Nakamura, Suita, all of Japan

[73] Assignee: Matsushita Electric Works, Ltd., Osaka, Japan

[21] Appl. No.: 09/147,799

[22] PCT Filed: Aug. 7, 1997

[86] PCT No.: PCT/JP97/02774

§ 371 Date: Mar. 10, 1999

§ 102(e) Date: Mar. 10, 1999

[87] PCT Pub. No.: WO99/08321

PCT Pub. Date: Feb. 18, 1999

[51] Int. Cl.[7] .................................................. B29B 9/08
[52] U.S. Cl. ......................... 264/117; 523/403; 523/466; 525/481
[58] Field of Search ............................ 264/117; 523/403, 523/466; 525/481

[56] References Cited

U.S. PATENT DOCUMENTS 4,137,188   1/1979   Uetake et al. .................... 252/62.1 P

FOREIGN PATENT DOCUMENTS 63-179920   7/1988   Japan .
2-189958    7/1990   Japan .
3-3258      1/1991   Japan .

*Primary Examiner*—Robert Dawson
*Assistant Examiner*—D. Aylward
*Attorney, Agent, or Firm*—Arent Fox Kintner Plotkin & Kahn, PLLC

[57] ABSTRACT

An epoxy resin encapsulating material for molding in a semiconductor chip by the use of a transfer molding device. The material has constituents of an epoxy resin, a curing agent, an inorganic filler, and a release agent. The material consists of 99 wt % or more of granules having a diameter of 0.1 to 5.0 mm and 1 wt % or less of minute particles having a diameter of less than 0.1 mm. The mass of the material exhibit an angle of slide of 20 to 40°, which demonstrates good flowability free from clogging a passage leading to a mold cavity in the transfer molding device, thereby assuring enhanced encapsulation quality. The material is prepared firstly by kneading the encapsulating composition having the above constituents and by solidifying the composition into a semi-cured solid body of B-stage condition. The sem-cured solid body is then pulverized into pieces having a diameter of 5.0 mm or less. The pieces are composed of granules having a diameter of 0.1 mm to 5.0 mm and minute particles having a diameter of less than 0.1 mm. Subsequently, heat is applied to melt a resin component of the encapsulating composition in the surfaces of the granules while continuously moving the granules so as to entrap the minute particles in a molten phase of the resin component. Thereafter, the molten phase is cooled to obtain epoxy resin encapsulating grains coated with a resin layer incorporating the minute particles having the diameter of less than 0.1 mm.

6 Claims, 1 Drawing Sheet

EPOXY RESIN SEALING MATERIAL FOR MOLDING SEMICONDUCTOR CHIP AND METHOD FOR MANUFACTURING THE SAME

BACKGROUND ART

1. Field of the Invention

The present invention is directed to an epoxy resin encapsulating material for molding in a semi-conductor chip and method of preparing the same.

2. Description of the Prior Art

Encapsulation of semiconductor chips has been made by a transfer molding using so-called tablets of an encapsulating composition composed of an epoxy resin, a curing agent, and an inorganic filler. The tablets are prepared by the steps of kneading the encapsulating composition and processing the same into a semi-cured body in the form of a sheet or wire, pulverizing the solid body into granules followed by being compacted into a cylindrical form. Thus prepared tablets are fed in a pot of a transfer-molding device and are forced into a mold cavity where they are molded to surround the semiconductor chip. Nowadays, there is proposed for enhancing encapsulation quality to use a multi-pot transfer molding device in which a plurality of pots are provided to encapsulate a plurality of the semiconductor chips at once with reduced length of runner leading from the pot to the associated mold cavity. As the number of the pots increases, the size of the tablets are required to be reduced to give the sufficient number of the tablets into each pot. In this respect, it is envisaged to utilize the pulverized granules of the encapsulating composition prior to being compacted into the tablet.

However, the granules after being pulverized from the semi-cured epoxy composition inherently includes a number of minute particles which are very likely to clog passages for supplying the encapsulating material to a metering section of the transfer molding device and for supplying it to the pots, thereby failing to supply a sufficient amount of the material to the mold cavity with attendant poor encapsulation. Such minute particles have a tendency to adhere to the large granules, they are difficult to be filtered out by the use of a sieve and are easily separated from the large granules when subjected to vibrations applied in the course of feeding the granules to the pot and/or the molding cavity. Further, the granules may be chipped at their corners when subjected to the vibrations to add resulting minute particles.

Even by the use of the tablets, the minute particles are easily separated from the tablets when subjected to the vibration while being fed to the pots and/or the cavities, thereby causing undesired clogging of the passages to the cavities.

In view of the problems, it is demanded to provide the epoxy encapsulating material in the form of the granules which can successfully avoid to clog the passages of the material in the transfer molding device.

SUMMARY OF THE INVENTION

The above problem has been solved in the present invention which provides an improved epoxy resin encapsulating material for molding in the semiconductor chip and method of preparing the same. The epoxy resin encapsulating material in accordance with the present invention has constituents of an epoxy resin, a curing agent, an inorganic filler, and a release agent and consists of 99 wt % or more of granules having a diameter of 0.1 to 5.0 mm and 1 wt % or less of minute particles having a diameter of less than 0.1 mm. The mass of the epoxy resin encapsulating material is characterized to exhibit an angle of slide of 20 to 40°, which demonstrates good flowability free from clogging the passage leading to the mold cavity, thereby assuring enhanced encapsulation quality. When the minute particles having a diameter of less than 0.1 mm are included in an amount of more than 1 wt % or the granules having a diameter of 0.1 mm to 5.0 mm are inclued in an amount of less than 99 wt %, the material is likely to clog the passage. Also, such clogging of the material is likely to occur with the use of the material having the angle of slide of more than 40°. Although it may be possible to prepare the encapsulating material having the angle of slide of less than 20°, the preparation takes a long period of time and is not practical for an economic reason.

The epoxy resin encapsulating material is prepared firstly by kneading the encapsulating composition having the above constituents to prepare a semi-cured body of B-stage condition. The semi-cured solid body is then pulverized into pieces having a diameter of 5.0 mm or less. The pieces are composed of granules having a diameter of 0.1 mm to 5.0 mm and minute particles having a diameter of less than 0.1 mm. Subsequently, heat is applied to melt a resin component of the encapsulating composition in the surfaces of the granules while continuously moving the granules so as to entrap the minute particles in a molten phase of the resin component. Thereafter, the molten phase is solidified to obtain an epoxy resin encapsulating grains coated with a resin layer incorporating the minute particles. In this manner, the grains having a diameter of 0.1 mm to 5.0 mm are formed respectively with resin coats which entrap the minute particles having a diameter of less than 0.1 mm. With this process, the epoxy resin encapsulating materials free from separate minute particles can be successfully prepared to satisfy the above size distribution as well as the angle of the slide.

In a preferred embodiment, the granules are heated while being stirred for effectively melting the resin component of the encapsulating composition in the surfaces of the whole granules as well as for avoiding the granules from combining too much with each other into unduly large bulks, thus facilitating to prepare the epoxy resin encapsulating material of uniform size.

Further, prior to forming the resin coat on the surface of the granules by application of heat, it is preferred to make a pre-treatment of adding water to a volume of the pulverized pieces in order to wet the surfaces of the granules. With this pre-treatment, the minute particles can be readily adhered to the wetted surfaces of the granules before the resin component is melted to form the molten phase, thereby increasing efficiency of entrapping the minute particles in the molten phase of the resin component in the immediately subsequent step.

A solvent or wetting agent may be added to a volume of the granules while stirring the granules for agglomeration thereof. The solvent is selected to be one capable of dissolving a resin component of the encapsulating composition in the surfaces of the granules to wet the surface for absorbing the minute particles therein. The wetting agent is selected for the same purpose of wetting the surfaces of the granules to absorb the minute particles therein and includes at least one selected from a group consisting of an epoxy resin, a curing agent, a release agent, and a surfactant each of which may be the same as or different from that of the epoxy encapsulating composition. The use of the release agent as the wetting agent is preferred to facilitate the encapsulation process.

These and still other objects and advantageous features of the present invention will become more apparent from the following detailed description of the invention and examples when taking in conjunction with the attached drawings.

BEST MODE FOR CARRYING OUT THE INVENTION

Figure 1:
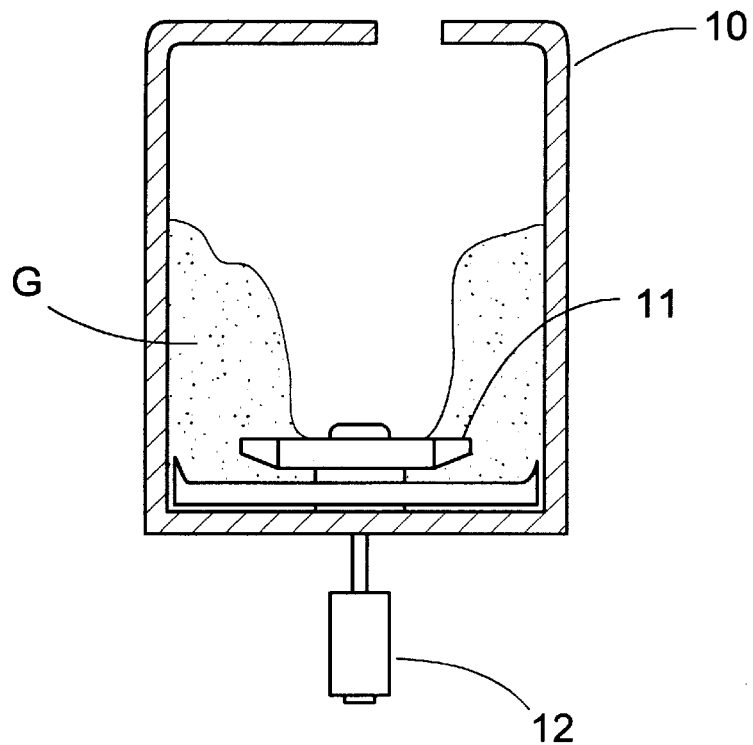
FIG. 1 is a schematic view of a mixer utilized to prepare an epoxy resin encapsulating material in accordance with the present invention.

An epoxy resin encapsulating material of the present invention is prepared in the form of grains for use to mold in a semiconductor chip within a transfer molding device. The encapsulating material is prepared from an encapsulating composition composed of an epoxy resin, a curing agent, a release agent and an inorganic filler. Additionally, the composition may include a curing accelerator, a surfactant, a silane coupling agent, a coloring agent, a stress reducing agent, a flame retardant as necessary.

The epoxy includes orthocresol-novolak-type epoxy resin, bisphenol-A-type epoxy resin, biphenyl-type epoxy resin, dicyclopentadiene-type epoxy resin, linear aliphatic epoxy resin, alicyclic epoxy resin, and a heterocyclic epoxy resin. The particular epoxy resin may be utilized alone or in combination.

The curing agent includes a phenol-novolac resin and its derivative, cresol-novolac resin and its derivative, a monohydroxy- or dihydroxy-naphthalene-novolac resin and its derivative, a condensation of p-xylene and a phenol or a naphthol, a phenol curing agent such as a copolymer of dicyclopentadiene and phenol, an amine curing agent, and an acid anhydride. The particular curing agent may be utilized alone or in combination. The phenol-novolac resin is preferred for reason of reducing hydroscopicity of the cured resin. The curing agent is blended in equivalent amount of 0.1 to 10 times in relation to the epoxy resin.

The release agent includes a fatty acid such as stearic acid, montanic acid, palmitic acid, oleic acid, and linoleic acid, a salt of the fatty acid such as a calcium salt, magnesium salt, aluminum salt and a zinc salt, of the fatty acid, an amido of the fatty acid, phosphoric ester, polyetylene, bisamide, polyolefin containing carboxyl group, and natural carnauba. The inclusion of the release agent enables the use of the epoxy resin having inherently high adhesive characteristic to the semiconductor chip and/or the lead-frame thereof, yet assuring release of cured resin from the mold and/or a plunger of transfer molding device.

The inorganic filler includes crystalline silica, fused silica, alumina, magnesia, titan oxide, calcium carbonate, magnesium carbonate, silicone nitride, talc, and calcium nitrate. The inorganic filler may be utilized either alone or in combination. The use of crystalline or fused silica is preferred to reduce coefficient of linear expansion of the cured epoxy resin as near as that of the semiconductor chip. The inorganic filler is preferred to be included in an amount of 60 to 95 parts by weight in relation to 100 parts of the sum of the resin component and the inorganic filler for lowering hygroscopicity as well as for assuring superior thermal resistance to the heat applied at the time of soldering the encapsulated semiconductor chip. The inorganic filler is selected to have an average diameter of 0.5 to 50 $\mu$m.

The curing accelerator includes 1,8-Diaza-bicyclo (5,4,0) undecene-7, a third-grade amine compound such as triethylenediamine and benzyldimethylamine, an imidazole compound such as 2-methylimidazole, 2-ethyl-4-methylimidazole, 2-phenylimidazole, and 2-phenyl-4-methylimidazole, and an organic phosphine compound such as triphenylphosphine and tributylphosphine.

The silane coupling agent includes an epoxy silane such as $\gamma$-glycidoxy-propyltrimethoxy silane, and an amino silane such as N-phenyl-$\gamma$-amino-propyltrimethoxy silane.

The surfactanct includes polyethylene glycol fatty acid ester, sorbitan fatty acid ester, and fatty acid monoglyceride.

The silane coupling agent includes an epoxy silane such as $\gamma$-glycidoxy-propyltrimethoxy silane, and an amino silane such as N-phenyl-$\gamma$-amino-propyltrimethoxy silane.

The coloring agent includes carbonblack and titanium oxide.

The stress-reducing agent includes a silicone gel, silicone rubber, and silicone oil.

The flame retardant includes antimony trioxide, a halide, and a phosphide.

One or more specific agent or compound may be utilized as each of the curing accelerator, silane coupling agent, release agent, coloring agent, stress reducing agent, surfactant, and flame retardant.

For preparation of the epoxy resin encapsulating material, the above resin component and the inorganic fillers are intermingled by a mixer, for example, HENSCHEL mixer and then kneaded while being heated to soften the resin component followed by being extruded into a sheet or rod, or like semi-cured solid body. The kneading and extrusion is made by the use of, for example, a pressure rollers, double-screw kneader, or extruder. The kneading is continued over such a period as to make the resin component sufficient compatible with the inorganic filler but not to proceed the curing of the resin component to a greater extent. Thereafter, the solid body is pulverized into pieces having a diameter of 5.0 mm or less. Filtering is made to remove greater granules having a diameter of more than 5.0 mm by the use of a sieve, when such greater granules remains after pulverization. The pulverization is made, for example, by the use of a rotary cutter, roller mill, or hammer mill. Thus pulverized pieces include granules having a diameter of not less than 0.1 mm and minute particles having a diameter less than 0.1 $\mu$m.

The pulverized granules are then agglomerated into the final epoxy resin encapsulating grains with respective resin coats entrapping therein the minute particles. A combination of heat or the like with stirring is applied to the volume of the pulverized granules to make the agglomeration with the entrapment of the minute particles. That is, as the heat or the like is applied to the granules being stirred, the resin component in the surface of the pulverized granules are melted to form molten phase which act to entrap the minute particles.

Agglomeration Process A

One process of making the above agglomeration of the granules utilizes a mixer which, as shown in FIG. 1, comprises a top-open container 10, a mixing blade 11 driven by a motor 12 to rotate within the container. By rotating the blade 11 at a relatively high speed, the pulverized granules G filled in the container 10 are stirred violently and are consequently caused to collide with each other to develop frictional heat which melts the resin component of the encapsulating composition present in the surface of the granules and having a lowest melting point. The temperature or the amount of the frictional heat can be adjusted by selecting the motor speed in order to melt the resin component having the lowest melting point. The granules with the resulting molten phase are caused to collide with each other to agglomerate through the interfaces of the molten phase. When the agglomerated granules becomes to have a certain enlarged size, they are sheared by the rotating mixing blade 11 back into grains of a smaller size. The above agglomeration and shearing are repeated to give the grains of the suitable size during which the minute particles have increased chances of being entrapped into the molten phase of the granules. Thereafter, the rotating speed of the mixing blade 11 is lowered to cease melting the resin component but to keep stirring the granules, allowing the molten phase to cool and solidify in order to obtain the grains with the minute particles confined in the resulting resin coat in the surface thereof. Through this stirring process, the resulting grains are made to have the angle of slide in the range of 20 to 40°. In this process, it is preferred to add an extra amount of the release agent at the time of lowering the rotating speed of the blade so as to provide a coat of the release agent on the pellets or provide a combination coat in which the release agent is dissolved in or mixed with the resin. The incorporation of the additional release agent in the surfaces of the grains facilitates the encapsulation process. The mixer available in this process includes HENSCHEL mixer, universal mixer, ribbon blender, and super mixer.

Agglomeration Process B

Another agglomeration process is to use a heater in combination with the above mixer. The heater is installed within the wall of the container 10 of FIG. 1 to heat the pulverized pieces or granules to a temperature for melting the resin component of the encapsulating composition present in the surfaces of the granules and having a lowest melting point. The stirring by the blade 11 continues during the heating so that the granules are agglomerated through the interfaces of the molten phase of the resin component while being prevented from becoming too large by the shear of the rotating blade. During this agglomeration, the minute particles are entrapped within the molten phase. Thereafter, the heating is stopped while keep stirring the granules by rotating the blade at a rotation speed not to cause melting of the resin component, thereby solidifying the molten phase to provide the grains with the resulting resin coat restricting the minute particles therewith. During this stirring, the agglomerated granules are caused by the shearing action of the blade to be broken into the resulting grains of uniform size. Through this stirring process, the resulting grains are made to have the angle of slide in the range of 20 to 40°. Also in this process, the release agent is preferred to be added to form on the granules the coat of the release agent or combination coat of the resin component and the release agent.

Agglomeration Process C

Figure 2:
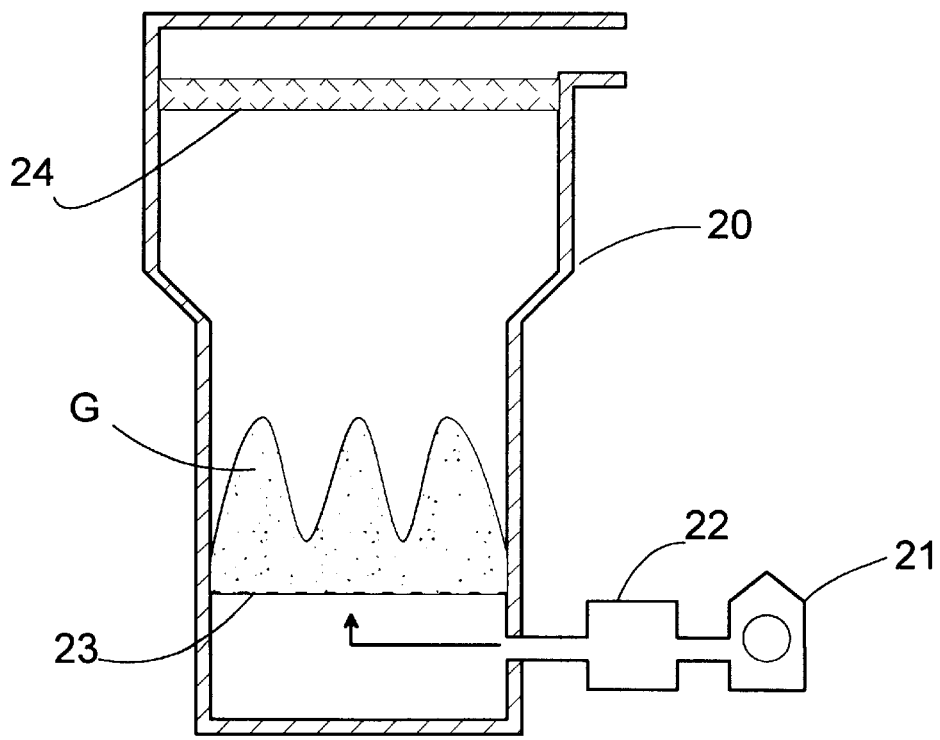
FIG. 2 is a schematic view of a fluidizing vessel utilized to prepare an epoxy resin encapsulating material in accordance with the present invention.

A further agglomeration process utilizes a fluidizing vessel which, as shown in FIG. 2, comprises a vessel 20, a blower 21, and a heater 22. The pulverized granules G are placed on a screen 23 within the vessel 20 and are suspended in a rising flow of air fed from the blower 21 to form a fluidized bed. A filter 24 is provided adjacent to an exhaust port for collection of the granules. Firstly, the heater is activated to heat the granules being suspended and stirred by the air flow so as to melt the resin component of the encapsulating composition appearing in the surface of the granules and having a lowest melting point. The granules with the resulting molten phase are caused to collide with each other in the fluidized bed to be agglomerated into a suitable size through the interfaces of the molten phase, during which the minute particles are entrapped by the molten phase. Since the granules are forced to move continuously in the fluidized bed, there occurs constant breakdown of the agglomerated granules such that the granules are prevented from agglomerated into unduly large bulk but are agglomerated into a suitable size. Thereafter, the heater temperature is lowered to make solidification of the agglomerated granules in the fluidized bed to give the resulting grains of the uniform size in which the minute particles are entrapped by the resulting resin coat. The minute particles failing to be entrapped in the molten phase are flown upward of the fluidized bed and recovered in the filter 24. Through this stirring process, the resulting grains are made to have the angle of slide in the range of 20 to 40°.

Also in this process, the release agent is preferably added at the lowered heater temperature in order to form on the pellets the coat of the release agent or combination coat of the resin component and the release agent.

The fluidizing vessel available for this process includes the device utilizing a centrifugal air flow and spiral air flow.

Agglomeration Process D

A further agglomeration process utilizes the mixer of FIG. 1 and is made to add a solvent to a volume of the pulverized granules being stirred in the mixer. With the addition of the solvent, the resin component of the encapsulating composition in the surface of the granules is dissolved to wet the surface for absorbing the minute particles therein as well as for aggregating the granules while the granule are being stirred. When the agglomerated granules becomes to have a certain enlarged size, they are sheared by the rotating mixing blade 11 back into a smaller size. The above agglomeration and shearing are repeated to give the grains of the suitable size during which the minute particles have increased chances of being absorbed in the wetted surfaces of the granules. Thereafter, a cool or hot air blow is fed to the volume of the agglomerated granules while continuing the stirring so as to dry the surfaces of the granules, thereby obtaining grains with the minute particles entrapped in the surfaces thereof. Through this stirring process, the resulting grains are made to have the angle of slide in the range of 20 to 40°. The solvent may be added at once or several times while stirring the granules. The solvent includes acetone, methanol, xylene, toluene, hexane, methyl-ethyl keton, ethyl acetate, cyclohexane, isopropanol, benzen, methyl acetone, and ethanol anhydride. The specific solvent may be used alone or in combination.

Agglomeration Process E

A further agglomeration process utilizes the mixer of FIG. 1 and is made to add to a wetting agent to a volume of the pulverized granules being stirred in the mixer. The wetting agent is at least one selected from a group consisting of an epoxy resin, a curing agent, a release agent, and a surfactant each of which may be the same as or different from that of the epoxy encapsulating composition. The wetting agent in the form of a liquid will spread over the surfaces of the granules to wet the same while the granules are being stirred, so as to absorb the minute particles in the wetted surfaces as well as to aggregate the granules. Thereafter, a cool or hot air blow is fed to the volume of the agglomerated granules while continuing the stirring so as to solidify the wetting agent covering the surfaces of the granules, thereby obtaining the granules with the minute particles entrapped in the surfaces thereof. Through this stirring process, the resulting grains are made to have the angle of slide in the range of 20 to 40°. The wetting agent may be added at once or several times while stirring the granules. The wetting agent which is solid at room temperatures is heated to be liquefied prior to being added to the granules. With the use of such wetting agent which is solid at the room temperatures, the desired granules can be obtained without forcibly cooling the granules. The release agent is preferable as the wetting agent to facilitate the encapsulation process. It is preferred to add 0.1 to 5.0 weight parts of the wetting agent in relation to 100 weight parts of the pulverized granules for balancing the agglomeration performance and the drying performance.

Agglomeration Process F

A still further agglomeration process utilizes a kneader-extruder to knead the epoxy encapsulating composition and extrude the resulting composition through a die opening to give a softened rod. The rod is then cut into pieces followed by being rounded while being cooled to provide grains having the diameter of 0.5 to 5.0 mm.

Prior to make the agglomeration of the pulverized granules in accordance with the above agglomeration processes of A to E, it is preferred to give a preliminary treatment for enhancing efficiency of entrapping and confining the minute particles in the surface of the granules. Following treatment is found advantageous for this purpose.

Pre-agglomeration Treatment

Water is added to a volume of the pulverized granules being stirred to wet the surface of the granules for aggregating the granules as well as absorbing the minute particles. Thus formed grains are then dried while being continuously stirred to remove the water content from the grains. With this treatment, the minute particles are adhered to wetted surfaces of the granules. This aggregation can be made by the use of the above mixer or fluidizing vessel. Thus treated granules are then agglomerated by one of the above processes A to E. Another liquid may be utilized instead of water provided that the liquid will not melt the resin component of the epoxy encapsulating composition. The liquid includes epoxy resin, curing agent, release agent and surfactant which may be of the same or different type as incorporated in the epoxy encapsulating composition.

The following examples are intended to illustrate the invention and should not be construed to impose limitations on the claims.

EXAMPLE 1

The example was intended to prepare the epoxy resin encapsulating material in accordance with the above Agglomeration process A.

An epoxy resin encapsulating composition was prepared by blending the following ingredients in the listed proportion.

Epoxy resin:
  3 weight parts of orthocresol-novolak-type epoxy resin [available from SUMITOMO CHEMICAL Co. Ltd. Japan as a tradename of ESCN195XL];
  3 weight parts of biphenyl-type epoxy resin [available from YUKA SHELL EPOXY Inc. Japan as a tradename of YX4000H];

Curing agent:
  5 weigth parts of phenol resin [available from ARAKAWA CHEMICAL INDUSTRY Ltd., Japan as a tradename of Tamanol 752];
Inorganic filler:
  80 weight parts of fused silica [available from TATSUMORI Ltd., Japan, as a tradename of R08];
Release agent:
  0.3 weight parts of stearic acid [available from DAINICHI CHEMICAL INDUSTRY Co., Ltd., Japan as a tradename of W02];
  0.3 weigth parts of natural carnauba [available from DAINICHI CHEMICAL INDUSTRY Co., Ltd., Japan as a tradename of □F-1-100];
Coupling agent:
  1 weight part of γ-glycidoxy-propyltrimethoxy silane [available from TORAY-DOW CORNING SILICONE Inc., Japan as a tradename of SH6040];
Curing accelerator:
  1 weight part of 2-phenylimidazole;
Coloring agent:
  0.2 weight part of carbon black;
Flame retardant:
  5 weight part of antimony trioxide.

Thus blended epoxy resin encapsulating composition was then fed to a double screw kneader where it was kneaded at 85° C. for 5 minutes. Then, the composition was cooled to be solidified followed by being pulverized by a cutter mill into the pulverized granules having a diameter of not greater than 0.5 mm and having a melting point of 63°. Thus pulverized granules consist of 90 wt % of granules having a diameter of 0.1 mm to 5.0 mm and 10 wt % of minute particles having a diameter of less than 0.1 mm.

50 Kg of the pulverized granules were placed into HENSCHEL mixer in order to agglomerate the granules based upon above agglomeration process A. The mixing blade 11 was rotated at 1500 rpm for 10 minutes to stir the granules and melt the resin component in the surface of the granules due to friction heat developed between the granules being stirred, thereby entrapping the minute particles to the resulting molten phase. Then, the rotation speed of the mixing blade was lowered 400 rpm to develop no substantial frictional heat, thereby cooling the molten phase into a solid phase while continuously stirring the granules for 20 minutes to provide the epoxy resin encapsulating grains formed on its surface with the resulting resin coat entrapping the minute particles.

EXAMPLE 2

This example was intended to prepare the epoxy resin encapsulating material in accordance with the above Agglomeration process A with the pre-treatment 50 Kg of thus pulverized granules prepared in Example 1 were placed into HENSCHEL mixer [manufactured by MITSUI MINING Co., Ltd.]. 2 Kg of pure water was sprayed to the granules while rotating a mixing blade 11 of the mixer at 400 rpm. Then, the mixing blades were kept rotated for 20 minutes so as to effect wetting of the granules for absorbing the minute particles on the wetted surfaces. Subsequently, the mixing blade 11 was rotated at 1500 rpm for 10 minutes to develop a friction heat due to the stirring and therefore melt the resin component in the surface of the granules for entrapping the minute particles to the resulting molten phase. Thereafter, the rotation speed of the mixing blade is lowered to 400 rpm and kept rotated for 20 minutes during which air was blown into the mixer for drying the granules, thereby obtaining the epoxy resin encapsulating grains formed on its surface with the resulting resin coat entrapping the minute particles.

EXAMPLE 3

This example was intended to prepare the epoxy resin encapsulating material in accordance with the above Agglomeration process C.

50 Kg of the pulverized granules prepared in Example 1 was placed into a fluidizing vessel [manufactured by OKAWARA MFG. Co., Ltd. Japan] as typically shown in FIG. 2, where a rising air flow at a room temperature was fed continuously upward from the bottom of the vessel to form a fluidized bed of the granules. Then, 0.5 Kg of toluene was added to the fluidized bed and the granules were kept stirred in the fluidized bed for 10 minutes, thereby melting a resin component of the epoxy resin composition in the surfaces of the granules to form a molten phase. Thereafter, the air flowing upward was heated to 40° C. and kept flowing upward to stir the granules for 60 minutes in order to dry the molten phase, thereby obtaining the epoxy resin encapsulating grains formed on its surface with the resulting resin coat entrapping the minute particles.

EXAMPLE 4

This example was intended to prepare the epoxy resin encapsulating material in accordance with the above Agglomeration process E 50 Kg of the pulverized granules prepared in Example 1 was placed into a ribbon blender. 0.5 Kg of stearic acid which is the same as incorporated in the epoxy encapsulating composition was added at a raised temperature of 70° C. while stirring the granules at 200 rpm for 15 minutes. During this stirring, the stearic acid effects to wet the surfaces of the granules to agglomerate the granules with the minute particles entrapped to the wetted surfaces after which the stearic acid was allowed to cool, thereby providing the epoxy resin encapsulating grains with the minute particles entrapped in the surface of the grains.

EXAMPLE 5

This example was intended to prepare the epoxy resin encapsulating material in accordance with the above Agglomeration process F.

The epoxy resin encapsulating composition was placed into a kneader-extruder to be kneaded therein and extruded through a 1.5 mm diameter heated die opening to give a soft rod. Immediately thereafter, the rod was cut into pieces which were then caused to roll down on a slant surface so as to be shaped into a rounded configuration while being cooled, thereby providing the epoxy resin encapsulating grains.

COMPARATIVE EXAMPLE 1

The pulverized granules of the epoxy resin encapsulating composition obtained in accordance with Example 1

COMPARATIVE EXAMPLE 2

The pulverized granules of the epoxy resin encapsulating composition obtained in accordance with Example 1 were classified through a sieve which passes the granules having the size of 0.3 mm or less. The resulting granules not passing the sieve were collected as specimens for comparative example 2.

COMPARATIVE EXAMPLE 3

The pulverized granules of the epoxy resin encapsulating composition obtained in accordance with Example 1 were compacted at a compression ratio of 92% into a 1.2 g weight cylindrical tablet having a diameter of 7.4 mm.

COMPARATIVE EXAMPLE 4

The grains obtained in Example 1 were again pulverized in the universal mixer rotating at 400 rpm for 10 minutes.

EVALUATION OF EXAMPLES AND COMPARATIVE EXAMPLES

The grains of Examples 1 to 5 and granule or tablet of comparative Examples 1 to 4 were evaluated in terms of the following characteristics as listed in Tables 1 and 2 below.

TABLE 1

| | Size distribution (%) | | Angle of slide (°) | Amount of dust (mg/m$^3$) | Ratio of Secondary Dust (%) | |
| --- | --- | --- | --- | --- | --- | --- |
| | Less than 0.1 mm | 0.1 to 5.0 mm | | | After 30 min. | After 60 min. |
| Example 1 | 0.05 | 99.95 | 26 | 0.03 | 0.1 | 0.2 |
| Example 2 | 0 | 100 | 20 | 0.01 | 0.1 | 0.2 |
| Example 3 | 0.01 | 99.99 | 21 | 0.02 | 0.1 | 0.2 |
| Example 4 | 0.09 | 99.91 | 31 | 0.04 | 0.1 | 0.2 |
| Example 5 | 0.09 | 99.91 | 39 | 0.04 | 0.1 | 0.2 |
| Comparative Example 1 | 10 | 90 | 51 | 0.31 | 1.0 | 2.0 |
| Comparative Example 2 | 0.1 | 99.9 | 41 | 0.12 | 2.0 | 4.0 |
| Comparative Example 3 | — | — | — | 0.12 | 2.0 | 4.0 |
| Comparative Example 4 | 5 | 95 | 35 | 0.12 | 2.0 | 2.0 |

TABLE 2

| | Metering Error (g) with 5 cc container | Metering Error (g) with 10 cc container |
| --- | --- | --- |
| Example 1 | 0.15 | 0.15 |
| Example 2 | 0.05 | 0.05 |
| Example 3 | 0.10 | 0.10 |
| Example 4 | 0.2 | 0.2 |
| Example 5 | 0.2 | 0.3 |
| Comparative Example 1 | 2.0 | 3.0 |
| Comparative Example 2 | 0.5 | 1.0 |
| Comparative Example 3 | — | — |
| Comparative Example 4 | 0.5 | 1.0 |

Size distribution was determined by the use of a series of sieves attached to a low-tap vibrator. 200 g of specimen were classified through the sieves while vibrating the sieves for 30 minutes to measure the weights of the grains or granules held on the respective sieves. Thus measured weights were calculated in relation to the weight of the specimens before classified to give the weight percentages of the granules having a diameter of 0.1 mm to 5.0 mm as well as the minute particles having a diameter of less than 0.1 mm.

Angle of slide was determined by the use of a 50 mm long glass-made conical funnel having a 50 mm diameter upper opening from the bottom end of which a 7 mm long and 7 mm diameter outlet tube $$\theta = \tan^{-1}\left(\frac{h}{50}\right)$$

extends. The funnel was set vertical above a 30 mm thick and 100 mm diameter glass-made plate at a height of 100 mm from the glass plate to the lower end of the outlet tube in concentric relation therewith. In accordance with a sampling method prescribed in JIS K6911, 300 g of grains or granules were placed gently on the plate through the funnel to form thereon a sloped mass of grains or granules. When the funnel was clogged by the grains or granules, a 2 mm diameter copper rod was utilized to discharge the grains or granules out of the funnel. The height (h) of the sloped mass to give the slide of angle as defined in the following formula. The measurements of the angle of slide ($\theta$) were made seven times for each specimen and an average of five intermediate values except for the maximum and minimum was selected for evaluation.

Amount of dust was determined by the use of a piezobalance dust monitor to concentration of dust appearing in a clean room of which dust concentration is maintained below 0.1 mg/m$^3$ when 200 g of specimen were caused to fall freely from a height of 0.5 m.

Ratio of secondary dust was determined by the use of a 2 litter plastic bottle attached to the low-tap vibrator. 500 g of specimen were placed into the bottles and vibrated respectively for 30 minutes and 60 minutes to measure a weight ratio (%) of dust having a diameter of 0.1 mm or less in relation to the weight of the specimen before subjected to the vibration, respectively for the specimens after 30 minutes and 60 minutes vibrations.

Metering error was measured as an index of metering stability or reluctance of the grains or granules causing the clogging in the passages of supplying the grains or granules to the mold cavity in the transfer molding device. Two measuring containers of 5 cc and 10 cc were employed to measure the grains or granules. The metering error was obtained by repeating to take the grains or granules in and out of the containers through the passage in the molding device in the over 1000 cycles and defined to be an error between the maximum and minimum weight of the granules taken out from each of the containers. Following table 2 shows the results.

As is clear from the above tables, Examples of the present invention are found to have extremely less content of the minute particles of a diameter less than 0.1 mm and to show small angle of slide ($\theta$), and low metering error (high metering stability), which demonstrates good flowability responsible for preventing undesired clogging of the passage to the mold cavity in the molding device. In other words, the grains of Examples 1 to 5 exhibits low metering error (high metering stability) as less as 0.05 to 0.2 for each of the measuring containers, in contrast to granules of comparative Examples 1, 2 and 4 of which metering error is 0.5 to 2.0. Thus, the grains of Examples are found to demonstrate very low extent to which the grains remain adhered to the container, i.e., the passage of the transfer molding device.

Also, the amount of dust as well as ratio of secondary dust are reduced to minimum so that the minute particles are not caused to scatter around even subjected to the vibrations during the course of being fed to the mold cavity, thereby preventing the clogging of the passage as well as realizing a clean work environment.

What is claimed is:

1. Epoxy resin encapsulating material for molding in a semiconductor chip comprising:

said epoxy resin encapsulating material having constituents of an epoxy resin, a curing agent, an inorganic filler, and a release agent and consisting of 99 wt % or more of granules having a diameter of 0.1 to 5.0 mm and 1 wt % or less of minute particles having a diameter of less than 0.1 mm; and mass of said epoxy resin encapsulating material exhibiting an angle of slide of 20 to 40°.

2. The epoxy resin encapsulating material as set forth in claim 1, wherein said granules are formed respectively with resin coats which entraps said minute particles having a diameter of 0.1 mm or less.

3. A process of preparing an epoxy resin encapsulating material as defined in claim 1, said method comprising the steps of:

kneading an encapsulating composition composed of an epoxy resin, a curing agent thereof, an inorganic filler, and a release agent to prepare a semi-cured body of B-stage condition;

pulverizing said semi-cured body into pieces having a diameter of 5.0 mm or less, said pieces comprising granules having a diameter of 0.1 mm to 5.0 mm and minute particles having a diameter of less than 0.1 mm;

melting a resin component of said encapsulating composition in the surface of said granules while moving said granules for entrapping said minute particles in a molten phase of said resin component; and solidifying said molten phase to obtain said epoxy resin encapsulating material in the form of grains.

4. The process as set forth in claim 3, wherein said pulverized pieces are heated while being stirred in order to melt said resin component of said encapsulating composition in the surface of said granules.

5. The process as set forth in claim 4, wherein a liquid is added to a volume of said pulverized pieces in order to wet said surfaces of said granules for absorbing said minute particles in the surface of said granules before melting said resin component in said surface.

6. The process as set forth in claim 5, wherein said liquid is selected from a group consisting of water, epoxy resin, curing agent, release agent and surfactant.

* * * * *